(12) United States Patent　　(10) Patent No.:　US 12,640,683 B2

Kalyanamahadevi Gopalan Jawarlal et al.　(45) Date of Patent:　May 26, 2026

(54) VOLTAGE CONTROLLED OSCILLATOR (VCO) CIRCUITS

(71) Applicant: SAMSUNG ELECTRONICS CO., LTD., Suwon-si (KR)

(72) Inventors: Vishnu Kalyanamahadevi Gopalan Jawarlal, Bengaluru (IN); Avneesh Singh Verma, Bengaluru (IN); Sanjeeb Kumar Ghosh, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/957,985

(22) Filed: Nov. 25, 2024

(65) Prior Publication Data

US 2026/0045907 A1　Feb. 12, 2026

(30) Foreign Application Priority Data

Aug. 8, 2024　(IN) ............................. 202441059988

(51) Int. Cl.
　H03B 5/12　(2006.01)
　H03B 5/24　(2006.01)
　H03L 7/099　(2006.01)

(52) U.S. Cl.
　CPC ........... H03B 5/124 (2013.01); H03B 5/1228 (2013.01); H03B 5/24 (2013.01); H03L 7/099 (2013.01);
　　　　　(Continued)

(58) Field of Classification Search
　CPC ........ H03B 5/124; H03B 5/1228; H03B 5/24; H03B 2200/0038; H03B 2200/004; H03L 7/099

(Continued)

(56) References Cited

U.S. PATENT DOCUMENTS 5,973,575 A　10/1999　Kamogawa et al.
6,150,893 A　11/2000　Fattaruso
　　　　(Continued)

FOREIGN PATENT DOCUMENTS

CN　　　212875768 U　　4/2021
DE　　102018107983 A1　10/2019
WO　　WO2016029946 A1　3/2016

OTHER PUBLICATIONS

Forsberg, et al., "A 65 nm CMOS varactorless mm-wave VCO", 2014 International Symposium on Integrated Circuits (ISIC), Dec. 10-12, 2014, 5 pages.

(Continued)

*Primary Examiner* — Richard Tan

(74) *Attorney, Agent, or Firm* — Morgan, Lewis & Bockius LLP

(57)　　　ABSTRACT

Embodiments herein disclose an inductor-capacitor voltage-controlled oscillator VCO circuit. The LC-VCO circuit includes a center tapped inductor connected in parallel with a varactorless capacitor bank, where the LC tank circuit resonates to produce an oscillating voltage; and a control circuit connected to a varistor capacitance circuit that comprises a voltage-controlled transistor based variable resistor in series with at least one capacitor, the varistor capacitance circuit being connected in parallel with the LC tank circuit and to a negative trans-conductance circuit. The control circuit includes an error amplifier and a conversion circuit configured to generate an output control voltage based on an input phase locked loop (PLL) control voltage, the output control voltage controlling a value of a capacitance for the varistor capacitance circuit through the variable resistor.

12 Claims, 11 Drawing Sheets

(52) U.S. Cl.
CPC ................ *H03B 2200/0038* (2013.01); *H03B 2200/004* (2013.01)

(58) Field of Classification Search
USPC ..................................................... 331/117 FE
See application file for complete search history.

(56) References Cited

U.S. PATENT DOCUMENTS

| | | | |
|---|---|---|---|
| 7,196,592 B2 | 3/2007 | Shi et al. | |
| 7,446,617 B2 | 11/2008 | Jang et al. | |
| 8,089,324 B2 | 1/2012 | Tarng | |
| 8,665,033 B2 | 3/2014 | Tang et al. | |
| 8,698,566 B2 | 4/2014 | Chern et al. | |
| 9,281,779 B2 | 3/2016 | Ainspan et al. | |
| 9,652,104 B2 | 5/2017 | Iwamoto et al. | |
| 2005/0030116 A1* | 2/2005 | Takagi | H03B 5/1296 331/177 V |
| 2006/0192598 A1* | 8/2006 | Baird | H03L 7/099 327/100 |
| 2011/0227615 A1* | 9/2011 | Faison | H03L 7/103 327/157 |
| 2018/0191360 A1 | 7/2018 | Groe et al. | |

OTHER PUBLICATIONS

Shiao, et al., "A 100-GHz Varactorless CMOS VCO Using Source Degeneration", 2012 IEEE/MIT-S International Microwave Symposium Digest, Jun. 12-22, 2012, 4 pages.

* cited by examiner

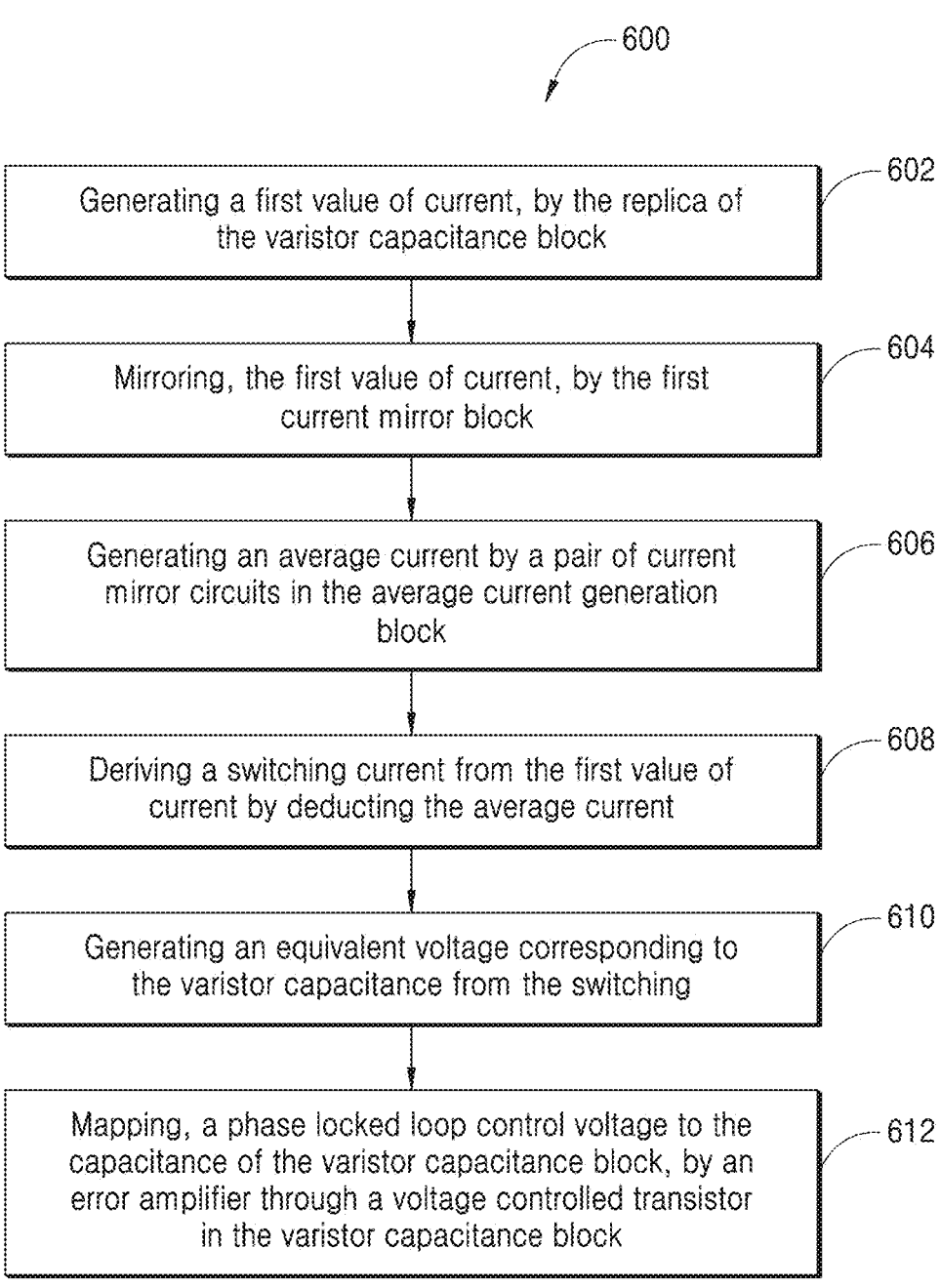

600

Generating a first value of current, by the replica of the varistor capacitance block — 602

Mirroring, the first value of current, by the first current mirror block — 604

Generating an average current by a pair of current mirror circuits in the average current generation block — 606

Deriving a switching current from the first value of current by deducting the average current — 608

Generating an equivalent voltage corresponding to the varistor capacitance from the switching — 610

Mapping, a phase locked loop control voltage to the capacitance of the varistor capacitance block, by an error amplifier through a voltage controlled transistor in the varistor capacitance block — 612

VOLTAGE CONTROLLED OSCILLATOR (VCO) CIRCUITS

CROSS REFERENCE TO RELATED APPLICATION(S)

This application is related to and claims priority from Indian Patent Application No. 202441059988, filed in the Indian Intellectual Property Office on Aug. 8, 2024, the content of which is incorporated herein by reference in its entirety.

TECHNICAL FIELD

Embodiments disclosed herein relate generally to semiconductor integrated circuits, and more particularly to voltage-controlled oscillator (VCO) circuits.

BACKGROUND

Typically, Inductance Capacitance voltage-controlled oscillators (LC-VCOs) have a high-quality factor leading to good phase noise. However, good phase noise also leads to a narrow frequency range. For increasing the frequency range of the LC-VCO, existing solutions use multiple VCOs, which require additional area and power.

Conventional LC-VCOs include a varactor. The varactor has a monotonic continuous voltage to capacitance dependence that may be placed in a negative feedback continuous time loop, such as in a phase locked loop (PLL). However, a controllable range of capacitance is less than 50% of total value for the varactor. The frequency range of the LC-VCO depends on the ratio of a controllable tank capacitance to total tank capacitance and is thus primarily limited by the varactor. Therefore, it would be desirable to provide a wide frequency range in LC-VCOs, with competitive area and power relative to traditional designs.

In existing technologies, a transformer is designed as a tuneable inductor with a tight constraint on phase matching to replace the varactor. However, the transformer consumes a large area in the LC-VCO.

FIG. 1 shows a conventional LC-VCO, 100, according to existing arts. LC-VCO 100 includes an LC tank circuit 107 including a center-tapped inductor 103 connected in parallel with a capacitance bank 102. Transistors M1 and M2 form a negative-gm (transconductance) circuit 104 that compensates for the loss of the LC tank. Capacitance bank 102 has capacitors that are controlled digitally for initial frequency calibration. C1 and C2 refer to MOS varactors (connected to drains of M1 and M2 through capacitors C3 and C4, respectively), and are controlled by a phase lock loop (PLL) through a control voltage $V_{CTRL}$. A voltage regulator generates a supply voltage $V_{LDO}$ to the LC_VCO. MOS varactors C1 and C2 are voltage-controlled variable capacitors. The frequency range of the LC-VCO depends on the ratio of controllable tank capacitance to total tank capacitance and is primarily limited by the varactor. For example, in a 50 fF total valued varactor, the controllable component is only 24 fF. In other words, instead of a variable capacitor that varies from 0 to 50 fF, there is an additional 25 fF component lying unusable. The drawback with this varactor is that less than 50% of the total capacitance value is controllable.

Hence, there is a need in the art for solutions which will overcome the above-mentioned drawback(s), among others.

SUMMARY

Embodiments of the inventive concept relate to an Inductance Capacitance voltage-controlled oscillator (LC-VCO).

Embodiments may increase the frequency range of the LC-VCO by replacing the varactor with an identical functional element with a higher ratio of controllable capacitance to total capacitance.

Voltage-controlled oscillator circuits disclosed herein may have a negative feedback continuous time loop.

Embodiments herein may map a phase locked loop control voltage to a value of a capacitance for a varistor capacitance block in the voltage-controlled oscillator circuit.

Embodiments of an LC-VCO herein may have increased frequency range by replacing a traditional varactor with a similar or identical functional element with a higher ratio of controllable capacitance to total capacitance. Further, embodiments of a VCO circuit may have a negative feedback continuous time loop. A phase locked loop control voltage may be mapped to a value of a capacitance for a varistor capacitance block in the VCO circuit.

In an embodiment, a voltage-controlled oscillator circuit includes an inductor-capacitor (LC) tank circuit comprising a center tapped inductor connected in parallel to a varactorless capacitor bank. The LC tank circuit resonates to produce an oscillating voltage at a frequency. The LC-VCO comprises a control circuit connected to a varistor capacitance circuit. The varistor capacitance circuit comprises a voltage-controlled transistor based variable resistor in series with a capacitor connected in parallel with the LC tank circuit and to a negative trans-conductance circuit. The control circuit comprises an error amplifier and a conversion circuit configured to generate an output control voltage based on an input PLL control voltage, where the output control voltage controls a value of a capacitance for the varistor capacitance circuit through the variable resistor.

Embodiments herein provide a method to control a voltage-controlled oscillator comprising generating equivalent voltage corresponding to the varistor capacitance from a switching current, by a voltage generation circuit of a control circuit. The method further comprises mapping, a phase locked loop control voltage to a capacitance by a control circuit comprising an error amplifier 408, for the varistor capacitance circuit through a voltage-controlled transistor in the varistor capacitance circuit. The equivalent voltage is forced to be equal in value to the phase locked loop control voltage by the control circuit. The equivalent voltage is utilized to map the phase locked loop control voltage to a value of the capacitance for the varistor capacitance circuit.

BRIEF DESCRIPTION OF FIGURES

Embodiments herein are illustrated in the accompanying drawings, throughout which like reference letters indicate corresponding parts in the various figures. The embodiments herein will be better understood from the following description with reference to the following illustrated drawings. Embodiments herein are illustrated by way of examples in the accompanying drawings, and in which:

FIG. 4B shows a block diagram of the LC-VCO, showing the blocks of the control block (404), according to embodiments as disclosed herein;

FIG. 4C shows a detailed block diagram of the LC-VCO according to the embodiments as disclosed herein;

FIG. 5 illustrates an example of a schematic of the voltage-controlled oscillator, according to embodiments as disclosed herein; and FIG. 6 illustrates a flowchart for a method to control a voltage-controlled oscillator, according to embodiments as disclosed herein.

DETAILED DESCRIPTION

Figure 1:
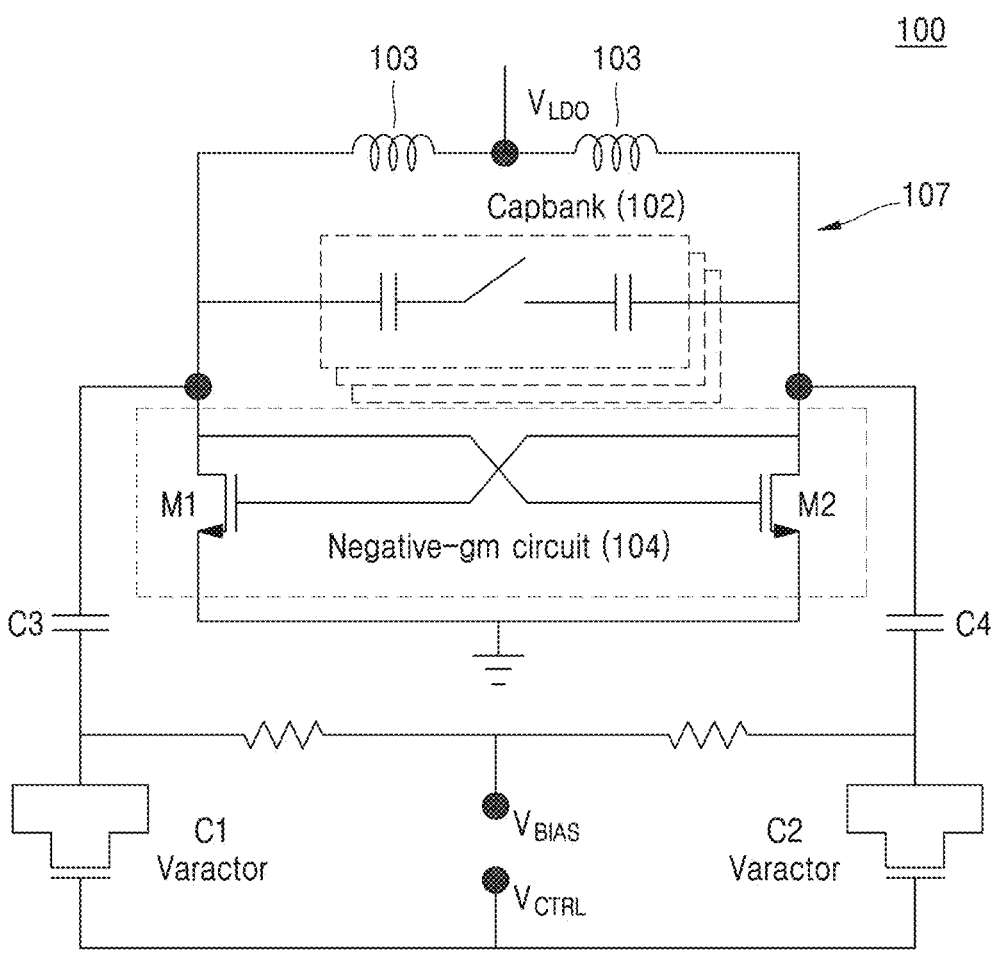
FIG. 1 shows a conventional LC-VCO, according to existing arts.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

For the purposes of interpreting this specification, the definitions (as defined herein) will apply and whenever appropriate the terms used in singular will also include the plural and vice versa. It is to be understood that the terminology used herein is for the purposes of describing particular embodiments only and is not intended to be limiting. The terms "comprising", "having" and "including" are to be construed as open-ended terms unless otherwise noted.

The words/phrases "exemplary", "example", "illustration", "in an instance", "and the like", "and so on", "etc.", "etcetera", "e.g.,", "i.e.," are merely used herein to mean "serving as an example, instance, or illustration." Any embodiment or implementation of the present subject matter described herein using the words/phrases "exemplary", "example", "illustration", "in an instance", "and the like", "and so on", "etc.", "etcetera", "e.g.,", "i.e.," is not necessarily to be construed as preferred or advantageous over other embodiments.

Embodiments herein may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by a firmware. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

It should be noted that elements in the drawings are illustrated for the purposes of this description and ease of understanding and may not have necessarily been drawn to scale. For example, the flowcharts/sequence diagrams illustrate the method in terms of the operations required for understanding of aspects of the embodiments as disclosed herein. Furthermore, in terms of the construction of the device, one or more components of the device may have been represented in the drawings by conventional symbols, and the drawings may show only those specific details that are pertinent to understanding the present embodiments so as not to obscure the drawings with details that will be readily apparent to those of ordinary skill in the art having the benefit of the description herein. Furthermore, in terms of the system, one or more components/modules which comprise the system may have been represented in the drawings by conventional symbols, and the drawings may show only those specific details that are pertinent to understanding the present embodiments so as not to obscure the drawings with details that will be readily apparent to those of ordinary skill in the art having the benefit of the description herein.

The accompanying drawings are used to help easily understand various technical features and it should be understood that the embodiments presented herein are not limited by the accompanying drawings. As such, the present disclosure should be construed to extend to any modifications, equivalents, and substitutes in addition to those which are particularly set out in the accompanying drawings and the corresponding description. Usage of words such as first, second, third etc., to describe components/elements/operations is for the purposes of this description and should not be construed as sequential ordering/placement/occurrence unless specified otherwise.

Briefly, embodiments herein may implement a voltage-controlled oscillator (VCO) by mapping a phase locked loop control voltage (an input control voltage) to an output control voltage that in turn controls an equivalent capacitance within the VCO. Referring now to FIGS. 2A through 6, where similar reference characters denote corresponding features consistently throughout the figures, there are shown embodiments.

Figure 2A:
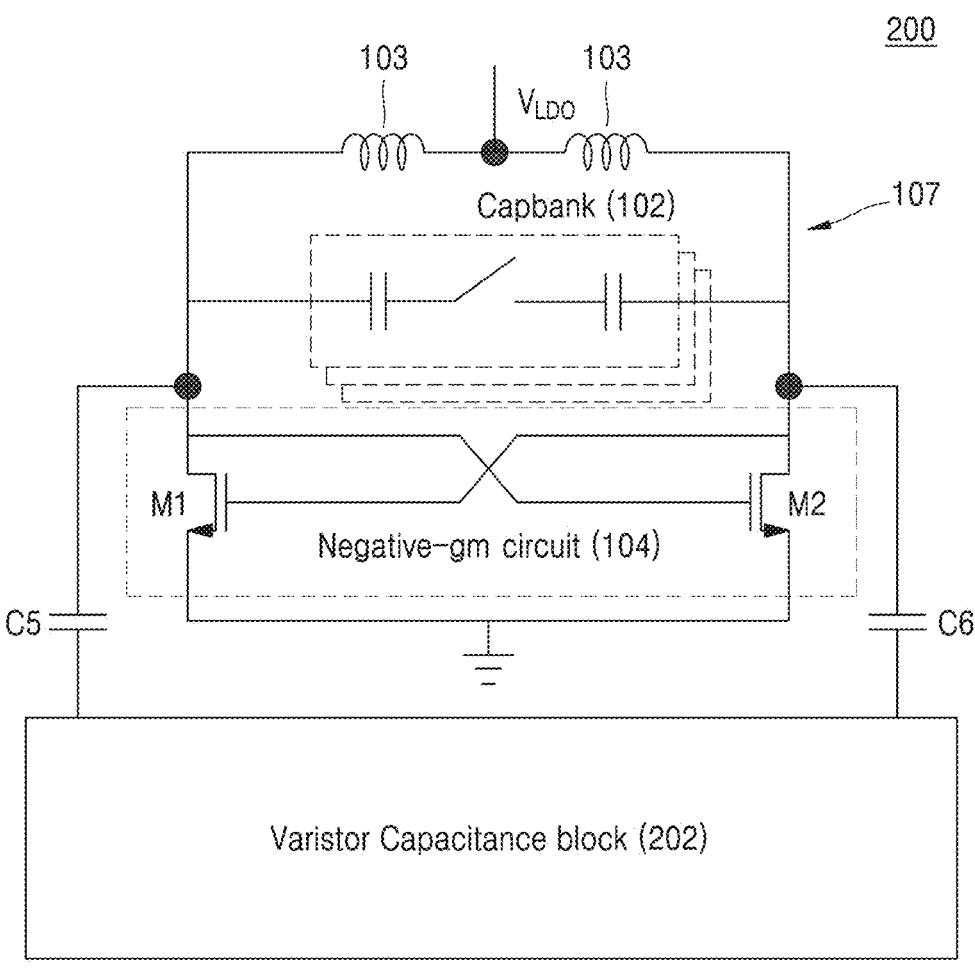
FIG. 2A illustrates a voltage-controlled oscillator circuit with a functional element to control the voltage-controlled oscillator, according to embodiments as disclosed herein.

FIG. 2A illustrates a voltage-controlled oscillator circuit 200 with a functional element to control the voltage-controlled oscillator. The functional element is a varistor capacitance circuit ("block") 202. The varistor capacitance block 202 may be based on the concept of equivalent capacitance seen by a source at a frequency and varying the equivalent capacitance. Other circuit components 102, 103, 104, 107, C5 and C6 (corresponding to capacitors C3 and C4) may be the same or similar as those described above for FIG. 1.

Figure 2B:
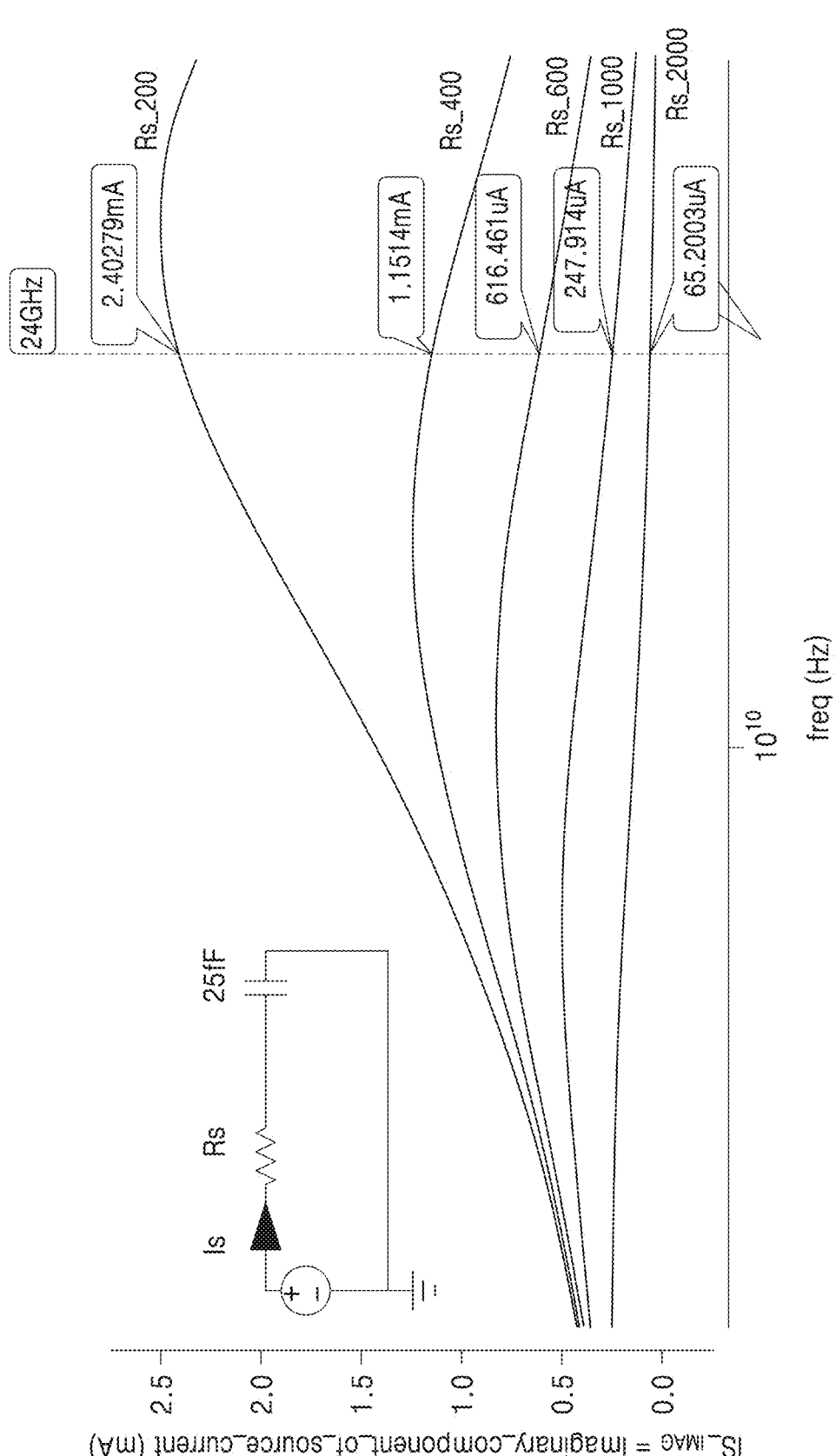
FIGS. 2B and 2C shows an example graph showing the relation of $R_S$ and equivalent capacitance $C_{EQ}$, according to embodiments as disclosed herein.
Figure 2C:
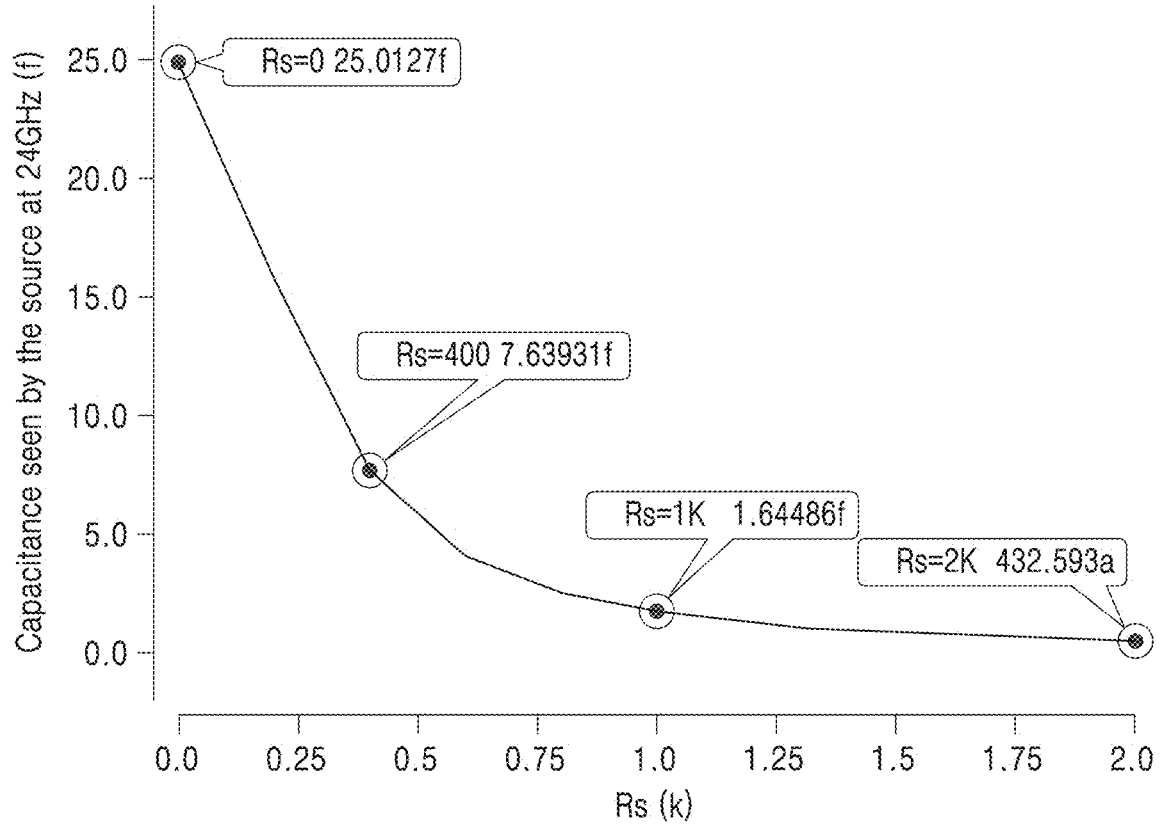

FIGS. 2B and 2C shows an example graph showing the relation of $R_S$ and equivalent capacitance $C_{EQ}$, according to embodiments as disclosed herein.

Consider for example, a source driving a capacitance of 25 fF in series with a resistance $R_S$ (an equivalent resistance shown in FIG. 3A) and frequency $\omega_0 = 6.28 \ast 24$ GHz (where

5

6

6.28 equals $2\pi$). It is observed as shown in FIG. 2B, when $R_S$ is swept from 0 to 2K$\Omega$, the imaginary component of source current keeps scaling down with increasing $R_S$.

$$I_{S\_IMAG} = \frac{\left(\frac{1}{\omega_0 C}\right)}{Rs^2 + \left(\frac{1}{\omega_0 C}\right)^2}$$

Therefore, the equivalent capacitance ($C_{EQ}$) "seen by the source" (the capacitance seen from the drains of transistors M1 and M2) is $$C_{EQ} = \frac{I_{S\_IMAG}}{\omega_0}$$

As the equivalent capacitance is inversely proportional to a value of $R_S$, the equivalent capacitance $C_{EQ}$ keeps declining with higher value of $R_S$, shown in FIG. 2C.

In an embodiment herein, the equivalent capacitance of the LC-VCO circuit may be varied by leveraging the quality factor. At the resonant frequency, the series impedance of the LC circuit is at a minimum and the parallel impedance is at maximum. The resonant frequency may be used for tuning and filtering the LC-VCO, because resonance occurs at a particular frequency for given values of inductance and capacitance. Considering, the series parallel transformation for an RLC network, the equivalent parallel capacitance $C_P$ (see FIG. 3B) is given by:

$$C_P = \frac{c_S}{1 + \left(\frac{1}{Q}\right)^2}$$

The equivalent parallel resistance $R_P$ (see FIG. 3B) is given by:

$$R_P = R_S * \left(1 + Q^2\right)$$

The quality factor of both the networks are the same since inherently loss is the same at the resonant frequency, therefore:

i. $Q_P = \dfrac{R_P}{X_P}$ and $Q_S = \dfrac{X_S}{R_S}$ ii. $Q_P = Q_S = Q$

From the above equations, it may be seen that an effective capacitance seen by the LC tank ($C_P$) may be reduced by reducing the quality factor. With $R_S = 0$ and $Q = \infty$, the value of $C_P = C_M$, where Cs is the total LC tank capacitance when capacitors are connected in series. On the other hand, when $Q = 0$ and $R_S = \infty$, $C_P$ becomes 0. By varying the value of $R_S$ between 0 and $\infty$, the value of $C_P$ (the effective capacitance seen by the LC tank circuit) may be varied between 0 and $C_P$.

Varying the value of resistance (the effective capacitance seen by the LC tank circuit) may be the basis for designing a variable cap at resonant frequency.

In an embodiment herein, equivalent loss resistance may be used to vary the effective capacitance. Using series to parallel transformation at the resonant frequency for a network, the equivalent parallel resistance $R_P$ is given by:

$$R_P = R_S + \frac{1}{R_S(\omega_0 C)^2}$$

With the above equation taking the form of $$x + \frac{1}{a^2 x},$$

the minima occur at $$R_S = \frac{1}{(\omega_0 C)};$$

this occurs at Q=1

$$R_P = R_S * \left(1 + Q^2\right)$$

Hence, the minimum value of $R_P$ occurs at Q=1, and the LC-VCO gain will be the lowest. $R_P$ at Q=1 is $$R_P = R_S * 2$$

The minimum value of $R_P$ is not a minimum bound on $R_S$ but instead on the maximum value of $C_S$, because with lower values of $R_S$, the Q is higher yielding a larger value of $R_P$. With the value of $\omega_0$ fixed, the constraint may be on the maximum value of $C_S$. The maximum value of $C_S$ together with the range of possible values of $R_S$ determines the tuning range. Therefore, by changing the value of $R_S$, the capacitance may be varied.

In an embodiment herein, it is observed that by varying the value of $R_S$, the values of $C_P$ may be varied between 0 and $C_S$. For values of $C_P$ close to $C_S$, Q and $R_P$ are maximum. For values of $C_P$ close to 0, Q and $R_P$ are minimum. At the minimum value of $R_P$, the LC-VCO gain is the lowest, which may be undesirable.

Figure 3A:
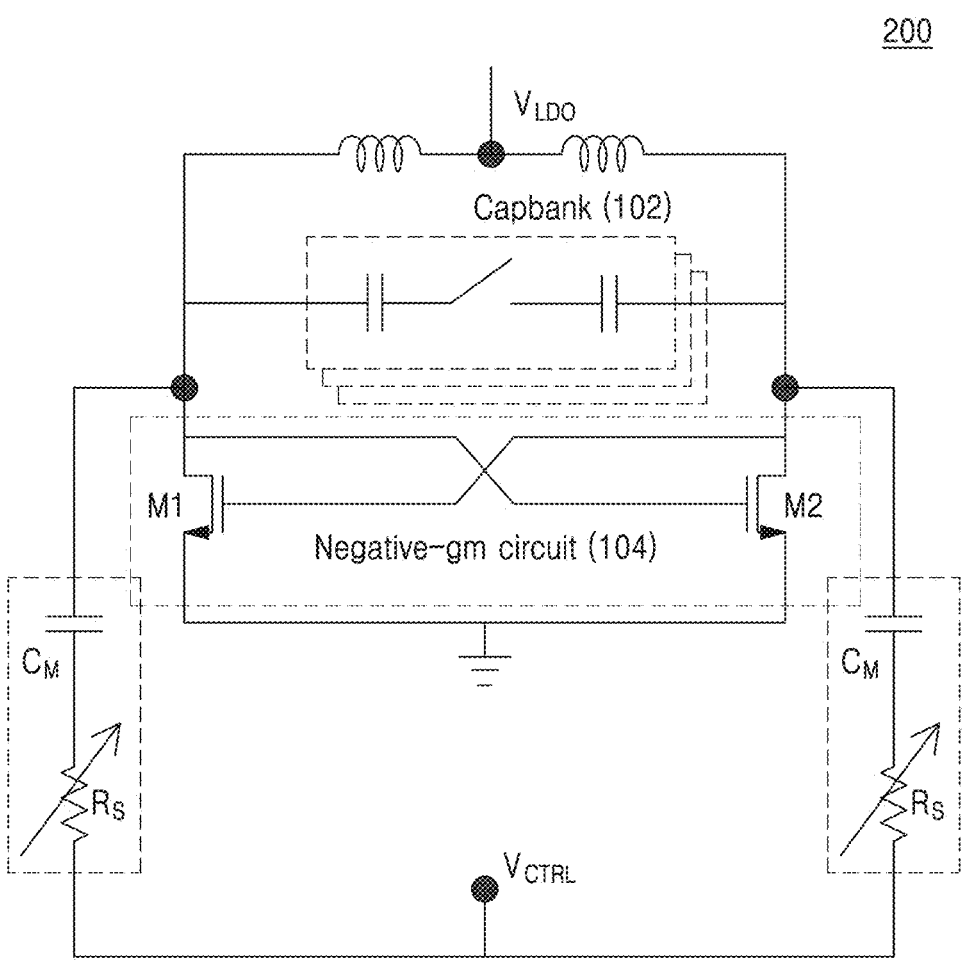
FIG. 3A illustrates a schematic equivalent diagram of the LC-VCO, having a variable resistor to control the capacitance of LC-VCO, according to embodiments as disclosed herein.

FIG. 3A illustrates a schematic equivalent diagram of the LC-VCO 200, having a variable resistor to control the capacitance of LC-VCO, according to embodiments as disclosed herein. The transistors $M_1$ and $M_2$ form a negative-gm circuit 104 that compensates for the loss of the LC tank. A capacitance bank 102 comprises capacitors that may be controlled digitally for initial frequency calibration. The varistor capacitance block 202 comprises a capacitor $C_M$ and a variable resistor $R_S$. The effective value of capacitance from the combination CM and Rs may be controlled by the variable resistor $R_S$. The variable resistor $R_S$ along with the capacitor together are called a varistor capacitance. The component having a variable resistor to control the capacitance is called varistor capacitance henceforth. The capacitor $C_M$ may include, but is not limited to, a metal capacitor. The capacitor may be of any capacitance value, wherein the value may be varied using the variable resistor.

Figure 3B:
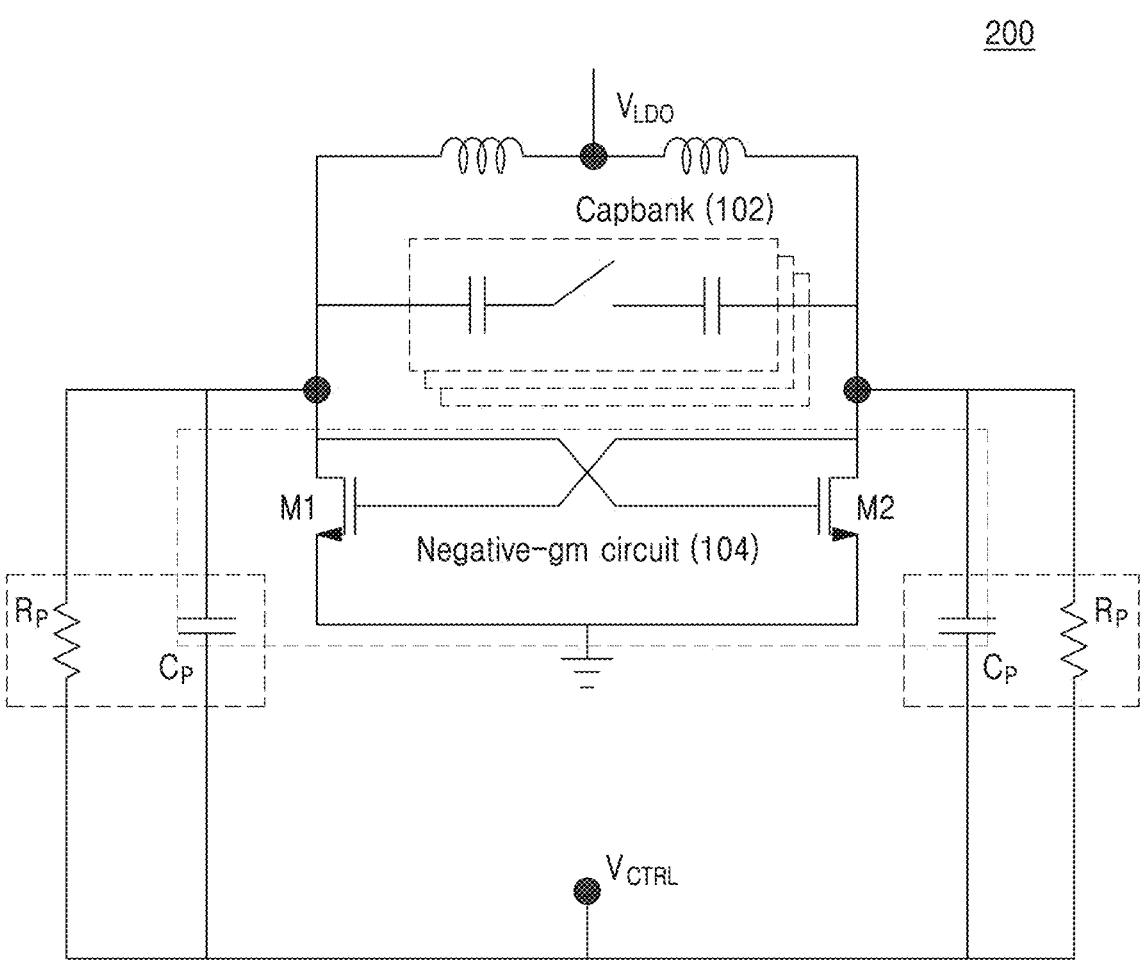
FIG. 3B shows an example of the parallel equivalent of the varistor capacitance block 202, according to embodiments disclosed herein.

In an embodiment herein, as it is observed that by varying the value of $R_S$, the values of capacitance may be varied between 0 and $C_S$, by using a control voltage ($V_{CTRL}$) to vary the value of the variable resistor $R_S$, the value of $C_M$ as seen by the LC-VCO tank circuit may be varied. FIG. 3B shows an example of the parallel equivalent of the varistor capacitance block (202), according to embodiments disclosed herein. The parallel resistance $R_P$ hits a minimum value close to Q=1 and it is to be noted that the minimum value of $R_P$ is the worst for LC-VCO gain.

Figure 4A:
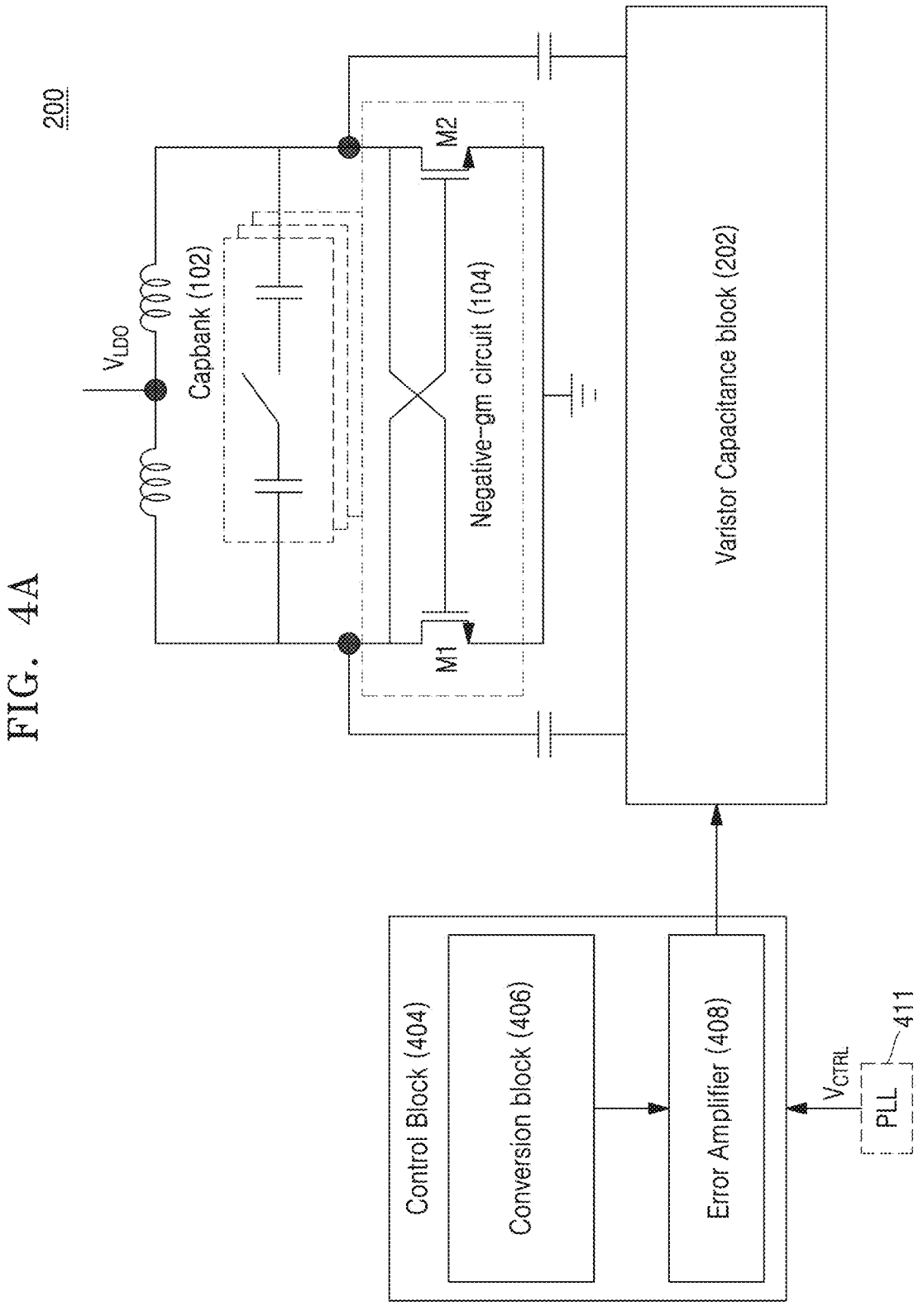
FIG. 4A illustrates a block level diagram for the LC-VCO, according to embodiments as disclosed herein.
Figure 5:
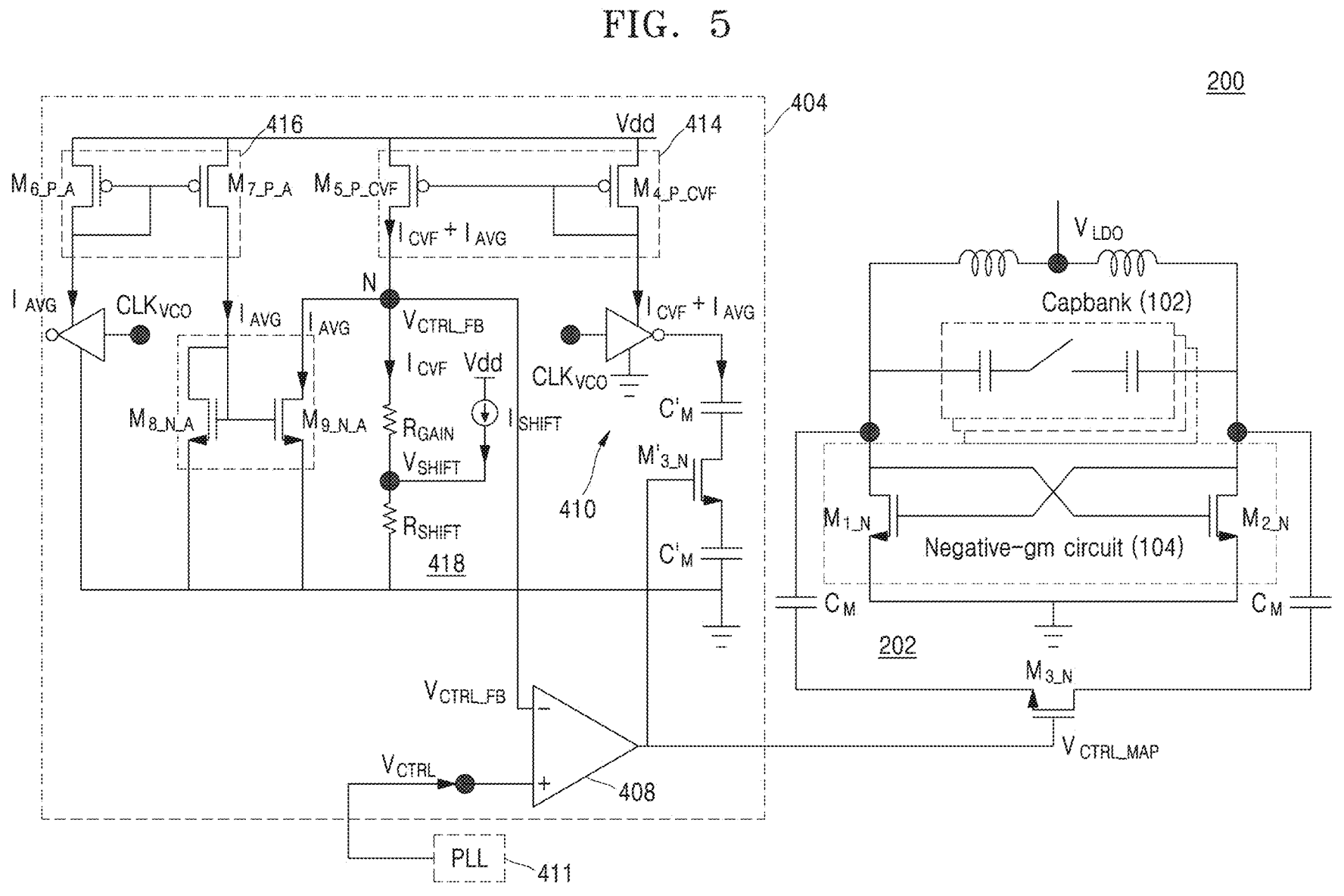

FIG. 4A illustrates a block level diagram for the LC-VCO 200, according to embodiments as disclosed herein. FIG. 5 is an example circuit schematic of the LC-VCO 200 of FIG. 4A. Referring to FIGS. 4A and 5, the varistor capacitance block 202 comprises a MOS transistor device $M_{3\_N}$, which may be used as a variable resistor in the LC-VCO. The MOS device $M_{3\_N}$ may have a large range constraint to utilize the full range of the capacitance $C_M$(e.g., the pair of capacitors $C_M$) of the varistor capacitance block 202. The control voltage $V_{CTRL}$ (interchangeably, "input control voltage $V_{CTRL}$") from a PLL 411 (external to, or including, LC-VCO 200) cannot be directly used to control the MOS device $M_{3\_N}$. Thus, the LC-VCO 200 comprises a control circuit ("block") 404. The control block 404 "maps the control voltage $V_{CTRL}$ value to the varistor capacitance block 202's control voltage $V_{CTRL\_MAP}$" to control the equivalent capacitance of the varistor capacitance block 202. (The voltage $V_{CTRL\_MAP}$ may be interchangeably referred to herein as an output control voltage of control circuit 404.) In other words, the output control voltage $V_{CTRL\_MAP}$ is based on the input control voltage $V_{CTRL}$ from the PLL 411, where $V_{CTRL\_MAP}$ controls the equivalent capacitance of the varistor capacitance block 202 (the equivalent capacitance is a function of $V_{CTRL\_MAP}$, and $V_{CTRL\_MAP}$ is mapped to $V_{CTRL}$).

In an embodiment herein, the MOS device is a voltage-controlled transistor based variable resistor (therefore interchangeably called "MOS transistor $M_{3\_N}$"). The MOS device $M_{3\_N}$ is connected in series with at least one capacitor (e.g., the left and right capacitors $C_M$, i.e., the left and right $C_M$ respectively having one end connected to a drain of transistor M1 and a drain of transistor M2, and an opposite end connected to a drain or source, respectively, of the transistor M3_N). The MOS device $M_{3\_N}$ and the capacitor(s) CM are connected in parallel with the LC tank circuit 107. The MOS device $M_{3\_N}$ and the capacitor(s) CM are further connected to a negative trans-conductance circuit 104.

In an embodiment herein, the control block 404 is connected to the gate input to the MOS device $M_{3\_N}$. The control block 404 comprises an error amplifier 408), and a conversion circuit ("block") 406 (e.g., performing voltage conversion and capacitance to voltage conversion). As mentioned above, the control block 404 may map a phase locked loop control voltage to a value of a capacitance for the varistor capacitance block 202 through the MOS device in the varistor capacitance block 202.

Figure 4B:
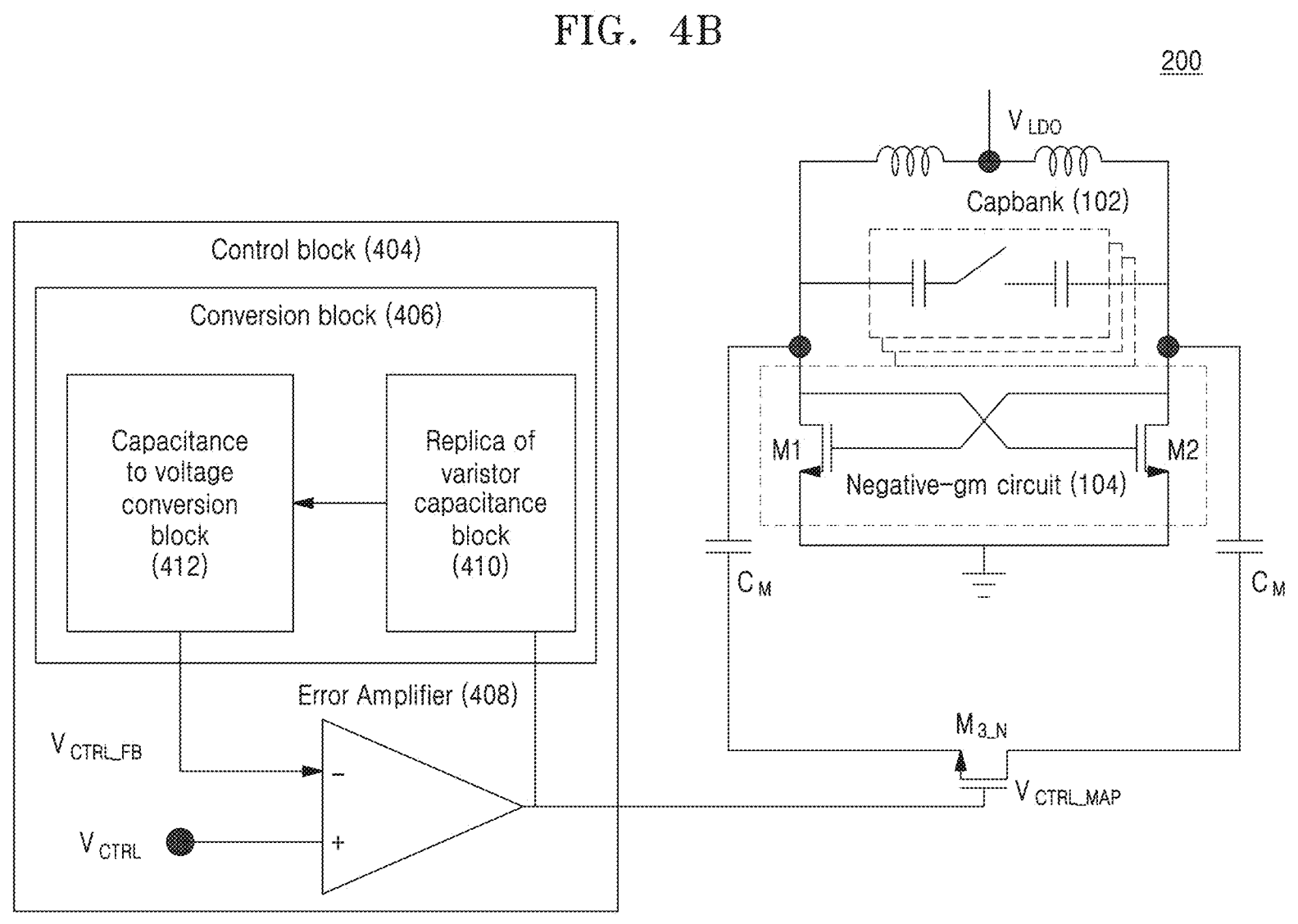

FIG. 4B shows a example block diagram of the LC-VCO 200, showing the blocks of the control block 404, according to embodiments as disclosed herein. The conversion block 406 comprises a replica of the varistor capacitance block 410 and a capacitance to voltage conversion circuit ("block") 412. The conversion block 406 may generate a copy of the varistor capacitance, i.e., the replica of the varistor capacitance block 410. The conversion block 406 may generate an equivalent voltage to map a phase locked loop control voltage to the capacitance for the varistor capacitance block 202 in the capacitance to voltage conversion block 412. The error amplifier 408 may map the varistor capacitance block's control voltage $V_{CTRL\_MAP}$ by taking the equivalent voltage as a negative feedback input. The control voltage may be given as a positive input to the error amplifier 408. The output of the error amplifier 408 is the varistor capacitance block's control voltage $V_{CTRL\_MAP}$. The varistor capacitance block's control voltage $V_{CTRL\_MAP}$ may be used to vary the equivalent capacitance of the varistor capacitance block 202.

In an embodiment herein, the phase lock loop voltage is taken as an input by the replica of the varistor capacitance block 410 to generate the copy of the varistor capacitance.

Figure 4C:
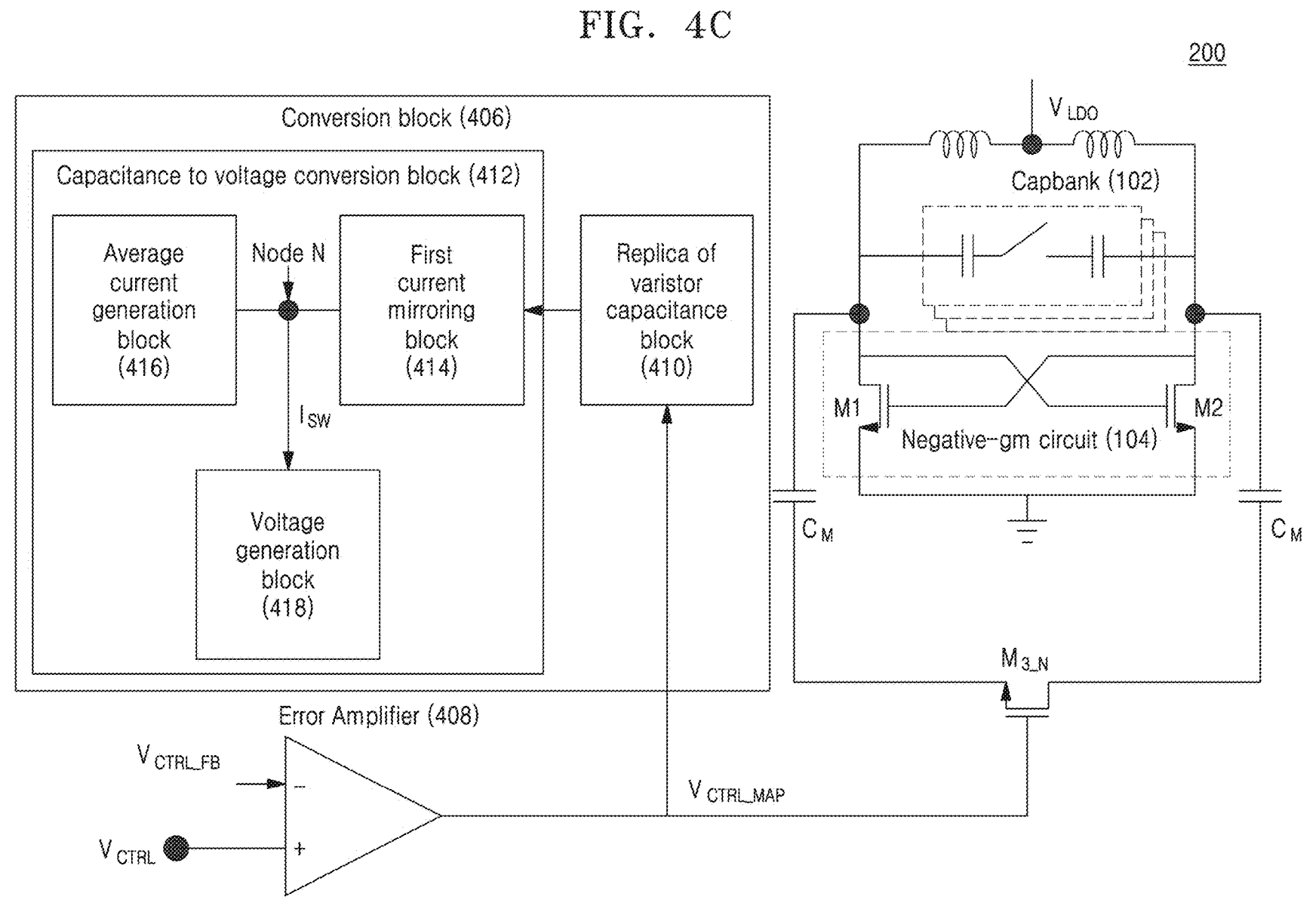

FIG. 4C shows a detailed example block diagram of the LC-VCO, according to the embodiments as disclosed herein. FIG. 4C will be discussed below with reference to the example circuit of FIG. 5. The replica of the varistor capacitance block 410 comprises a capacitor $C_M$ and a variable resistor $R_S$, A MOS device $M_{3\_N}$ may be used as a variable resistor. The MOS device may be a voltage-controlled transistor based variable resistor. The MOS device may be connected in series with at least one capacitor $C_M$. The replica of the varistor capacitance may also comprise a switching element. The switching element may include, but is not limited to, an inverter with input clock frequency $F_{VCO}$.

In an embodiment herein, the replica of the varistor capacitance block 410 may generate a first value of current. The first value of current may be, but is not limited to, a switching current $I_{CVF}$ and an average current $I_{AVG}$. The switching element with inverter with input clock frequency $F_{VCO}$ and self-capacitance and parasitic may generate the average current. The capacitor(s) $C_M$ along with the switching element may generate the switching current. The capacitance value of $C_M$ may be at the VCO frequency $F_{VCO}$ only, as the LC-VCO may detect the capacitance value only at the resonant frequency, which is the VCO frequency $F_{VCO}$.

In an embodiment herein, the capacitance to voltage conversion block 412 may comprise a first current mirroring block 414. The first current mirroring block 414 may mirror the first current value generated by the replica of the varistor capacitance block 410. The current through the first current mirroring block 414 is denoted by $I_F$:

$$I_F = I_{CVF} + I_{AVG}$$
$$I_{CVF} = C_M V F_{VCO}$$
$$I_{AVG} = C_{SELF} V F_{VCO} + I_{SHORT\_CKT}$$
$$I_F = C_M V F_{VCO} + C_{SELF} V F_{VCO} + I_{SHORT\_CKT}.$$

In an embodiment herein, the capacitance to voltage conversion block 412 may comprise an average current generation block 416. The average current generation block 416 may comprise a second switching element. The second switching element may be, but is not limited to, an inverter with input clock frequency $F_{VCO}$, and a pair of current mirroring circuits. The average current generation block 416 may generate an average current. The average current generated is mirrored a couple of times by the pair of current mirroring circuits in the average current generation block 416. The value of the average current is the equal value and opposite of the average current generated by the first current mirroring block 414. The average current generated in the average current mirroring block may be $-I_{AVG}$.

In an embodiment herein, the node $I_{SW}$ has the first value of current from the first current mirroring block 414 and the average current from the average current generation block 416. As the average current from the average current generation block 416 is the opposite as the first value of current, the total current at node $I_{SW}$ is:

$$I_F + (-I_{AVG}) = I_{SW}$$

$$I_{CVF} + I_{AVG} - I_{AVG} = I_{SW}.$$

The average current is deducted to obtain the switching current reflective of the capacitance $C_M$ from the first value of current. The total current that flows through node N is $I_{CVF}$; i.e., the switching current generated by the switching element and loading of the capacitance $C_M$.

In an embodiment herein, the capacitance to voltage conversion block 412 may comprise a voltage generation circuit ("block") 418. The voltage generation block 418 may generate the equivalent voltage corresponding to the varistor capacitance $C_M$ from the switching current $I_{CVF}$ of the replica of the varistor capacitance block 410. The voltage generation block 418 may comprise a gain resistance $R_{GAIN}$, a current source $I_{SHIFT}$ connected to a voltage source $V_{dd}$, and a resistance $R_{SHIFT}$. The total current, which is the switching current, may flow from the node N to the capacitance to voltage conversion block 412. Thus, the switching current may flow through $R_{GAIN}$. The net current flowing through $R_{GAIN}$ is $I_{CVF} = C_M VF_{VCO}$. The voltage generation block 418 may generate the equivalent voltage using a mapping function from $I_{CVF}$ and $R_{GAIN}$.

In an embodiment herein, the equivalent voltage is forced to be equal in value to the phase locked loop control voltage by the voltage generation block 418. The equivalent voltage is given to the error amplifier 408 to generate a mapped varistor capacitance block's control voltage $V_{CTRL\_MAP}$. The equivalent voltage is utilized to map the phase locked loop control voltage to the capacitance for the varistor capacitance block 202. As the equivalent voltage is forced to be equal in value to the phase locked loop control voltage, $V_{CTRL} = V_{CTRL\_FB}$.

$$V_{CTRL} = V_{GAIN} + V_{SHIFT}$$

$$V_{CTRL} = R_{GAIN} * I_{CVF} + V_{SHIFT},$$

this is the large signal transfer function.

$\Delta V_{CTRL} = R_{GAIN} * \Delta I_{CVF}$, this is the small signal transfer function since $V_{SHIFT}$ changes very little with $I_{CVF}$ $$\Delta V_{CTRL} = R_{GAIN} * F_{VCO} * V * \Delta C_M$$

$$\Delta C_M = \frac{\Delta V_{CTRL}}{R_{GAIN} * F_{VCO} * V}$$

The transfer function obtained for $\Delta C_M$ is the small signal transfer function from the control voltage $V_{CTRL}$ to the varistor capacitance in the LC-VCO. The transfer function is used to map the phase locked loop voltage with the equivalent voltage generated by the control block 404. The transfer function obtained is the programmable offset with the switching current, that varies the value of capacitance $\Delta C_M$. The error amplifier 408 generates the mapped varistor capacitance block 202's control voltage $V_{CTRL\_MAP}$ using the transfer function, i.e., utilized in varying the value of capacitance $\Delta C_M$. Therefore, by varying the value of $V_{CTRL}$, the value of capacitance $C_M$ is varied.

FIG. 5 illustrates an example of a schematic of the voltage-controlled oscillator 200, according to embodiments as disclosed herein. The upper portion of the LC tank may be the same as described above. Thus, transistors $M_{1\_N}$ and $M_{2\_N}$ form a negative-gm circuit 104 that compensates for the loss of the LC tank. A capacitance bank 102 has capacitors that may be controlled digitally for initial frequency calibration. An inductor-capacitor (LC) tank circuit 107 comprising a center tapped inductor is connected in parallel to a varactorless capacitor bank 102. The LC tank circuit resonates to produce an oscillating voltage at a frequency. A supply voltage to the LC_VCO is marked as $V_{LDO}$ which is generated from a voltage regulator. As the frequency range of the LC-VCO depends on the ratio of controllable tank capacitance over total tank capacitance, it is controlled through the varistor capacitance block 202.

In an embodiment herein, the varistor capacitance block 202 comprises a MOS device $M_{3\_N}$ used as a variable resistor in the LC-VCO. The MOS device $M_{3\_N}$ has a large range constraint to utilize the full range of the capacitance $C_M$ of the varistor capacitance block 202. The control voltage $V_{CTRL}$ from the negative PLL may not be directly used to control the MOS device $M_{3\_N}$. Thus, the LC-VCO comprises a control block 404. The control block 404 maps the control voltage $V_{CTRL}$ value to varistor capacitance block's control voltage $V_{CTRL\_MAP}$ value to control the equivalent capacitance of the varistor capacitance block 202 by controlling the MOS device $M_{3\_N}$. In other words, the output control voltage $V_{CTRL\_MAP}$ is based on the input control voltage $V_{CTRL}$ from the PLL 411, where $V_{CTRL\_MAP}$ controls the equivalent capacitance of the varistor capacitance block 202 (the equivalent capacitance is a function of $V_{CNTRL\_MAP}$, and $V_{CNTRL\_MAP}$ is mapped to $V_{CTRL}$).

In an embodiment herein, the control block 404 comprises a conversion block 406 and an error amplifier 408. The conversion block 406 comprises a replica of the varistor capacitance block 410, wherein the replica comprises a voltage-controlled transistor $M_{3\_N'}$ (corresponding to transistor $M_{3\_N}$) and a plurality of capacitance $C_M'$ (each corresponding to a capacitor CM of varistor capacitance circuit 202). The control block 404 comprises a first current mirroring block 414, and an average current generation block 416. The transistors in the current mirror block $M_{4\_P\_CVF}$ and $M_{5\_P\_CVF}$ are current mirror pairs. Similarly, the transistors in the average current generation block 416 ($M_{6\_P\_A}$, $M_{7\_P\_A}$) and ($M_{8\_N\_A}$, $M_{9\_N\_A}$) are current mirror pairs. The transistors $M_{5\_P\_CVF}$, $M_{7\_P\_A}$ and $M_{9\_N\_A}$ are current controlled current sources. The current through $M_{4\_P\_CVF}$ is:

$$(I_{CVF} = C_M VF_{VCO}) + (I_{AVG} = C_{SELF} VF_{VCO} + I_{SHORT\_CKT})$$

$C_M VF_{VCO}$ is the switching current driven by an inverter with input clock frequency $F_{VCO}$ and cap loading of $C_M$, and $C_{SELF} VF_{VCO}$ is the average current driven by inverter with input clock frequency $F_{VCO}$ and only self-capacitance loading and parasitic capacitance. The value of capacitance $C_M$ is sensed at the VCO frequency $F_{VCO}$ only, as the LC-VCO detects the capacitance value only at the resonant frequency, i.e., VCO frequency $F_{VCO}$.

In an embodiment herein, the current-mirror pairs in the average current generation block (416) ($M_{6\_P\_A}$, $M_{7\_P\_A}$)

and ($M_{8\_N\_A}$, $M_{9\_N\_A}$) are added to subtract out the average current term related to short circuit current and self-loading capacitance and parasitic capacitance current.

Therefore, the current flowing into the $V_{CTRL\_FB}$ node through $M_{5\_P\_CVF}$ is:

$$I_{CVF} + I_{AVG}.$$

The current flowing into the $V_{CTRL\_FB}$ node through $M_{9\_N\_A}$ is:

$$I_{AVG}.$$

The net current flowing through the $V_{CTRL\_FB}$ node to $R_{GAIN}$ (of the capacitance to voltage conversion block 412) is $I_{CVF} = C_M V F_{VCO}$.

The switching current $I_{CVF}$ is significant to develop a mapping function from the control voltage $V_{CTRL}$ to the variable capacitance.

The equivalent voltage obtained from the control block 404 is forced to be equal to the control voltage, that is the phase locked loop voltage.

$$V_{CTRL} = V_{CTRL\_FB}$$

$$\Delta V_{CTRL} = R_{GAIN} * F_{VCO} * V * \Delta C_M$$

$$\Delta C_M = \frac{\Delta V_{CTRL}}{R_{GAIN} * F_{VCO} * V}$$

The error amplifier 408 generates the mapped varistor capacitance block 202's control voltage (V) (i.e., $V_{CTRL\_MAP}$) using the transfer function, which is utilized in varying the value of capacitance $\Delta C_M$. Therefore, by varying the value of $V_{CTRL}$, the value of capacitance $C_M$ is varied.

The transfer function obtained is a small signal transfer function from the control voltage $V_{CTRL}$ to the varistor capacitance in the LC-VCO. The mapping of the phase locked loop control voltage makes the voltage-controlled oscillator meet the limitations such as, the LC-VCO is linear and time-invariant, non-inverting, monotonic, variable frequency using $V_{CTRL}$, and has infinite or near infinite resolution by keeping a check on the ratio of controllable capacitance to the total capacitance.

In an example scenario, when the LC-VCO is tested, the performance of the LC-VCO has a 20% higher frequency range achieved with a wide frequency range with a single LC-VCO. The maximum frequency achievable is higher by 6% than the conventional LC-VCO. For example, the present voltage-controlled oscillator circuit enables designing 28 GHz LC-VCO for high speed serializer/deserializer (SerDes) with lower design effort. When compared to a dual LC-VCO solution, 20% lower area is achieved.

The voltage control oscillator circuit may support protocols with multiple data rates. The LC-VCO has lower deterministic jitter and power supply induced jitter. Due to better power supply rejection ratio (PSRR), there is a lower phase offset and UP DN mismatch with $V_{CTRL}$ shift control. A $K_{VCO}$ range of the LC-VCO is programmable over a 10× range. The wide range of $K_{VCO}$ provides variation for PLL Bandwidth control to optimize jitter and stability margin.

FIG. 6 shows a method, 600, to control a voltage-controlled oscillator, according to embodiments disclosed herein. The method may be applied to control the LC-VCO 200 described above or similar circuitry. At operation 602, a first value of current is generated by a replica of a varistor capacitance block 410. The first value of current includes switching current and average current. The switching current is generated by a first switching element with a capacitance loading to varistor capacitance of a varistor capacitance block (e.g., 202). The average current is generated by the first switching element with self-loading capacitance of the first switching element. At operation 604, the first value of current is mirrored by the first current mirroring block (e.g., 414). At operation 606, an average current is generated by a pair of current mirror circuits in the average current generation block (e.g., 416). The average current is generated by the second switching element with self-loading capacitance of the second switching element. The average current generated is opposite in value of the average current through the first current mirroring block.

At operation 608, the switching current is obtained at a node (e.g., N) from the first value of current by deducting the average current from the first value of current. At operation 610, an equivalent voltage is generated corresponding to the varistor capacitance from the switching current, by a voltage generation block (e.g., 418) of a control block (e.g., 404). At operation 612, a phase locked loop control voltage is mapped to the capacitance of the varistor capacitance block by an error amplifier (e.g., 408) through a voltage-controlled transistor in the varistor capacitance block. The equivalent voltage is forced to be equal in value to the phase locked loop control voltage by the control block. The equivalent voltage is utilized to map the phase locked loop control voltage to the value of the capacitance for the varistor capacitance block. Some or all of the various actions in method 600 may be performed in the order presented, in a different order or simultaneously (if possible). Further, in some embodiments, some actions listed in FIG. 6 may be omitted.

The method may be implemented in at least one embodiment through or together with a software program written in e.g., Very high-speed integrated circuit Hardware Description Language (VHDL) another programming language, or implemented by one or more VHDL being executed on at least one hardware device. The device may also include means which could be e.g., hardware means like e.g., an ASIC, or a combination of hardware and software means, e.g., an ASIC and an FPGA, or at least one microprocessor and at least one memory with software modules located therein. The method embodiments described herein could be implemented partly in hardware and partly in software. Alternatively, embodiments may be implemented on different hardware devices, e.g., using a plurality of CPUs.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments and examples, those skilled in the art will recognize that the embodiments and examples disclosed herein may be practiced with modification within the scope of the embodiments as described herein.

13

We claim:

1. A voltage-controlled oscillator circuit, comprising:

an inductor-capacitor (LC) tank circuit comprising a center tapped inductor connected in parallel with a varactorless capacitor bank, wherein the LC tank circuit resonates to produce an oscillating voltage at a frequency; and a control circuit connected to a varistor capacitance circuit, wherein the varistor capacitance circuit comprises a voltage-controlled transistor based variable resistor in series with at least one capacitor, the varistor capacitance circuit being connected in parallel with the LC tank circuit and to a negative trans-conductance circuit, wherein the control circuit comprises an error amplifier and a conversion circuit configured to generate an output control voltage based on an input a phase locked loop (PLL) control voltage, the output control voltage controlling a value of a capacitance for the varistor capacitance circuit through the voltage-controlled transistor based variable resistor, and wherein the conversion circuit generates:

a varistor capacitance as a replica of the capacitance for the varistor capacitance circuit; and the output control voltage as an equivalent voltage to map the PLL control voltage to the capacitance for the varistor capacitance circuit.

2. The voltage-controlled oscillator circuit as claimed in claim 1, wherein the conversion circuit comprises:

a replica of the varistor capacitance circuit; and a capacitance to voltage conversion circuit, wherein the capacitance to voltage conversion circuit comprises:

a first current mirroring circuit configured to mirror a first current value generated by the replica of the varistor capacitance circuit, wherein the first current value comprises a switching current and an average current;

an average current generation circuit configured to generate the average current; wherein the average current is deducted to obtain the switching current reflective of the capacitance from the first current value; and a voltage generation circuit configured to generate equivalent voltage corresponding to the varistor capacitance from the switching current of the replica of the varistor capacitance circuit, wherein the equivalent voltage is forced to be equal in value to the phase locked loop control voltage by the voltage generation circuit, and wherein the equivalent voltage is utilized to map the phase locked loop control voltage to the capacitance for the varistor capacitance circuit.

3. The voltage-controlled oscillator circuit as claimed in claim 2, wherein the replica of the varistor capacitance circuit comprises a first switching element driving the replica of the varistor capacitance circuit to generate the average current, and the switching current.

4. The voltage-controlled oscillator circuit of claim 2, wherein the average current generation circuit comprises a second switching element.

5. The voltage-controlled oscillator circuit as claimed in claim 1, wherein the negative trans-conductance circuit is configured to compensate for losses of the LC tank circuit.

6. The voltage-controlled oscillator circuit as claimed in claim 1, wherein the voltage-controlled oscillator circuit is at least one of a system on chip circuit and a semiconductor integrated chip circuit (IC).

7. A method to control a voltage-controlled oscillator (VCO) comprising:

generating equivalent voltage corresponding to a varistor capacitance of the VCO from a first current value, by a voltage generation circuit of a control circuit; and mapping an input control voltage to a capacitance of a varistor capacitance circuit by an error amplifier, for the varistor capacitance circuit through a voltage-controlled transistor in the varistor capacitance circuit, wherein the equivalent voltage is forced to be equal in value to the input control voltage by the control circuit, and wherein the equivalent voltage is utilized to map the input control voltage to a value of the capacitance for the varistor capacitance circuit.

8. The method as claimed in claim 7, wherein the method comprises:

generating a first current value by a replica of the varistor capacitance circuit;

generating an average current by an average current generation circuit;

obtaining a switching current from the first current value of current by deducting the average current.

9. The method as claimed in claim 8, wherein the method comprises: mirroring the first current value generated by the replica of the varistor capacitance circuit; wherein the first current value comprises the switching current and the average current.

10. The method as claimed in claim 8, wherein the switching current comprises an added programmable offset component to the switching current to vary the value of the capacitance for the varistor capacitance circuit.

11. The method of claim 7, wherein the input control voltage is a phase locked loop control voltage.

12. A voltage-controlled oscillator circuit, comprising:

an inductor-capacitor (LC) tank circuit comprising a center tapped inductor connected in parallel with a varactorless capacitor bank, wherein the LC tank circuit resonates to produce an oscillating voltage; and a control circuit connected to a varistor capacitance circuit, wherein the varistor capacitance circuit comprises a voltage-controlled transistor based variable resistor in series with at least one capacitor, the varistor capacitance circuit being connected in parallel with the LC tank circuit and to a negative trans-conductance circuit, wherein the control circuit comprises an error amplifier and a conversion circuit configured to generate an output control voltage based on an input control voltage, the output control voltage controlling a value of a capacitance for the varistor capacitance circuit through the voltage-controlled transistor based variable resistor, and wherein the conversion circuit is further configured to generate:

a varistor capacitance as a replica of the capacitance for the varistor capacitance circuit; and the output control voltage as an equivalent voltage to map a phase locked loop control voltage to the capacitance for the varistor capacitance circuit.

* * * * *